(12) United States Patent
Broghammer et al.

(10) Patent No.: US 7,121,893 B2
(45) Date of Patent: Oct. 17, 2006

(54) ELECTRICAL SWITCH HAVING AN ELECTRICAL CONNECTION ELEMENT

(75) Inventors: Peter Broghammer, Wurmlingen (DE); Peter Wahl, Villingen-Schwenningen (DE)

(73) Assignee: Marquardt GmbH, Rietheim-Weilheim (DE)

( * ) Notice: Subject to any disclaimer, the term of this patent is extended or adjusted under 35 U.S.C. 154(b) by 0 days.

(21) Appl. No.: 11/186,617

(22) Filed: Jul. 21, 2005

(65) Prior Publication Data

US 2006/0009053 A1     Jan. 12, 2006

Related U.S. Application Data

(63) Continuation of application No. PCT/EP04/00445, filed on Jan. 21, 2004.

(30) Foreign Application Priority Data

Jan. 22, 2003    (DE)    ............................ 103 02 305

(51) Int. Cl.
    *H01R 13/66*    (2006.01)
    *H01R 33/945*   (2006.01)
(52) U.S. Cl. .................................. 439/620.24
(58) Field of Classification Search ............ 439/83, 439/876, 76.1, 79, 80, 875, 620, 620.24
    See application file for complete search history.

(56) References Cited

U.S. PATENT DOCUMENTS 4,542,438 A    9/1985    Yamamoto ............. 361/403

| | | | |
|---|---|---|---|
| 4,655,516 A | 4/1987 | Shaffer et al. | 439/67 |
| 4,902,237 A | 2/1990 | Huetson | 439/83 |
| 5,451,174 A | 9/1995 | Bogursky et al. | 439/876 |
| 6,224,399 B1 | 5/2001 | Yacoub | 439/83 |
| 6,522,528 B1 * | 2/2003 | Yamane | 361/601 |

FOREIGN PATENT DOCUMENTS

| | | |
|---|---|---|
| DE | 32 33 225 A1 | 3/1983 |
| DE | 44 22 787 A1 | 1/1995 |
| EP | 0 930 812 A2 | 7/1999 |
| JP | 03-138874 A1 | 6/1991 |
| JP | 06-052911 A1 | 2/1994 |
| JP | 2000-306624 A1 | 11/2000 |
| WO | WO 02/078029 A1 | 10/2002 |

* cited by examiner

*Primary Examiner*—Javaid H. Nasri
(74) *Attorney, Agent, or Firm*—Burr & Brown

(57) ABSTRACT

An electrical switch for an electric device is provided, including a contact system including at least one electrical power supply line, an electronic control circuit and an electrical connection element arranged between at least one contact face of the control circuit and the power supply line. The electrical connection element has at least one metal pin that is fixed in an electrically non-conductive fixing element such that the pin is aligned with respect to the contact face and the power supply line, and such that the pin protrudes from the fixing element on both sides thereof to contact the contact face and the power supply line.

21 Claims, 5 Drawing Sheets

ELECTRICAL SWITCH HAVING AN ELECTRICAL CONNECTION ELEMENT

CROSS REFERENCE TO RELATED APPLICATIONS

This application is a continuation of International Application No. PCT/EP2004/000445, having an international filing date of Jan. 21, 2004, which designated the United States, the entirety of which is incorporated herein by reference. This application also claims the benefit of German Application No. 103 02 305.4, filed Jan. 22, 2003, the entirety of which is incorporated herein by reference.

FIELD OF THE INVENTION

The present invention generally relates to an electrical switch having an electrical connection element, and in particular, to an electric tool switch having an electrical connection element.

BACKGROUND OF THE INVENTION

Electric tool switches, such as those disclosed in WO 02/078029 A1, for example, and such as those for a rechargeable electric tool, in addition to the associated contact system, often include an electronic control circuit for the purpose of driving the electric motor in the electric device. Electrical connection elements serve the purpose of supplying the control circuit with electrical voltage, the connection elements on the one hand making contact with corresponding contact faces for the control circuit and, on the other hand, making contact with power supply lines for the electrical voltage to the switch. The power supply lines may simultaneously act as terminals for the supply of electrical voltage to the contact system of the switch such that the electrical voltage for the control circuit can be connected.

A robust and more reliable electrical connection between the power supply lines for the voltage, especially those to the contact system, and the contact faces for the control circuit is particularly important for electric tool switches. This is particularly the case for switches in rechargeable electric tools due to the very high electric currents flowing therethrough. The production of such a robust connection requires considerable complexity in the manufacture of a suitable switch and presents problems when handling the switch during assembly. Soldering is especially undesirable for providing the connection during the manufacture of the switch in view of the risk of impermissible heating of adjacent components in the control circuit and of soldering flux sprays. Accessibility or the like in the electrical switch for the purpose of producing the connection is often also impaired.

An electrical connection element which leads to a contact face on a printed circuit board is known from DE 32 33 225 A1. The connection element has a metal pin which is connected to the contact face. This device has a significant disadvantage, however, associated with the complex and imprecise assembly of this connection element.

An electrical connection element for a printed circuit board which can be assembled more precisely and is SMD (surface mounted device)-compatible is disclosed in U.S. Pat. No. 6,224,399. This electrical connection element included four pins which are fixed in a strip-like fixing element made from an insulating material. The pins are aligned with respect to the associated contact faces by means of the fixing element, for contact-making purposes, and protrude on both sides from the fixing element. A plug can be plugged onto the pins, whereby the connection element serves the purpose of forming a mating element for a plug. However, inducement to use the connection element in an electrical switch for an electric tool is not disclosed in this document.

SUMMARY OF THE INVENTION

The present invention is based on the object of developing an electrical switch that is easy to assemble. In particular, it is an object of the present invention to provide an electrical connection element which can be handled in a simple manner and which can be used in electric tool switches.

The electrical switch according to the present invention is provided with a module-like electrical connection element which comprises at least one metal pin and a fixing element which is made from an electrically non-conductive material. The pin is fixed in the fixing element such that the pin is firstly aligned with respect to the associated contact face and the power supply line and secondly protrudes from the fixing element on both sides for the purpose of making contact with the contact face and the power supply line. Contact may be made with the contact face using the SMD (surface mounted device) technique. Such a connection element can advantageously be handled and assembled in a simple manner when producing the switch. The present invention also provides further refinements of the invention, primarily regarding simple handling when assembling the connection element.

It is possible for all of the connection lines required for the purpose of supplying voltage to the electronic control circuit, for example for the purpose of controlling the rotation speed of the electric tool, to be arranged in one fixing element. In this case, the modular connection element has a plurality of pins, preferably four pins. The fixing element may be approximately U-shaped, such that the four pins can be arranged, for example, at the corners of the U.

Due to the modular design of the connection element, the connection element can be fitted directly using automated fitting machines and soldered in a soldering unit, laser-welded, resistance-welded or electrically connected to the contact face in some other way, especially when producing the printed circuit board for the control circuit. In this case, the fixing element holds the pin in position and guarantees precise positioning of the connection element on the control circuit. The modular connection element may, in this case, advantageously be fitted and soldered completely in the multiple panel.

The fixing element may be designed in a simple manner to be in the form of a frame which can be easily handled by an automated fitting machine. The fixing element is preferably made from plastic. When producing the fixing element by injection molding, the pin can be injection molded into the fixing element at the same time, which represents a saving in terms of manufacturing steps and costs.

In order to be able to conduct higher electrical currents, it is possible for the pin to be made from copper. The pin can also be tin-coated on the surface thereof. The pin preferably has a contact plate at one end thereof which faces the contact face of the control circuit such that the connection element is fixed on the corresponding contact face of the control circuit on the printed circuit board via the contact plate even when the printed circuit board is produced.

When assembling the printed circuit board for the control circuit in the switch, the pin of the connection element, which is already located on the printed circuit board, is then plugged onto the power supply line with its other end, for which purpose corresponding openings, holes, apertures, receptacles or the like are expediently located in the power supply line. Subsequently, the pin is attached, for example, by soldering especially selective soldering, laser-welding, resistance-welding or the like, to the power supply line such that the complete printed circuit board for the control circuit and the remaining preassembled switch, which contains the contact system, are joined and electrically connected only at the end of the assembly chain. In this case, the necessary solder points can be advantageously arranged outside of the switch, which prevents contamination or damage to adjacent regions. Due to consistent soldering and/or welding techniques performed on the electrical connection element, the contact resistances are very low. As a result, heating of the switch is reduced, even at higher flowing currents, for example, in the case of rechargeable electric tools.

The power supply line, by means of which the electrical voltage for the electrical switch is supplied, may be in the form of a stamped grid. Such a stamped grid is also suitable for higher currents. The power supply line is firstly in connection with the contact system of the switch and possibly secondly in connection with the control circuit of the electrical switch via the pin. Since the electrical and/or electronic components, for example a freewheeling diode, a power transistor or the like, of the control circuit are arranged on a printed circuit board, it is possible for the contact face to be in the form of a conductor track, such as a contact pad, on the printed circuit board. Then, the pins can be arranged in the fixing element, corresponding to the layout of the control circuit, such that they are located in the immediate vicinity of the contact faces for the terminals of the electrical and/or electronic power components in the control circuit. As a result, the high current which flows through the power components need only be carried over very short sections of the conductor tracks on the printed circuit board of the control circuit, which counteracts the risk of the control circuit being thermally impaired.

In order to make it possible to fit the components in a simple manner by means of an automated machine, the electrical and/or electronic components of the control circuit are preferably those which can be processed using a SMD (surface mounted device) technique. It is then further possible for the contact face of the electrical and/or electronic component to be an SMD terminal located directly on and/or at the component. The pin of the connection element, which leads to the terminal of the component, is in this case designed to be shortened, if necessary, such that the pin ends directly on the component. A pin which has been shortened in this manner sits, for example, directly on the freewheeling diode of the control circuit, which has a sandwich-like design.

According to one embodiment, the printed circuit board for the control circuit simultaneously acts as a cooling body and as a cover for the entire housing of the switch, in addition to its function as a printed circuit board or carrier. For this purpose, the printed circuit board is made from a metal part, the surface of which is provided with an electrically insulating layer on which the electrical and/or electronic components of the control circuit are fitted, and the conductor tracks or contact pads are also provided on the electrically insulating layer. The metal part is arranged on an outer side of the housing of the switch corresponding to the otherwise conventional cooling body. The metal part is fixed in a simple manner to the housing by means of a spring-elastic clip such that the printed circuit board is also fixed by means of this clip, in addition to the retaining soldered connection of the connection element, to the power supply line. In order to further improve heat dissipation, the clip may also be a resilient, additional cooling body element.

In addition to the improvements mentioned above, the advantages achieved by the present invention can especially be seen in that the electrical switch is composed of two separate units, namely the electronic control circuit and the contact system. These two units can be separately preassembled, and the connection element can be attached during the production of the control circuit in a conventional automated fitting machine and in the soldering unit. At the end of the assembly process, the two units are then joined by means of the connection element using a suitable high current connection technique to form the complete switch. The connection element according to the present invention can also be produced in a cost-effective and reliable manner.

BRIEF DESCRIPTION OF THE DRAWINGS

For a better understanding of the nature and objects of the present invention, reference should be made to the following detailed description of a preferred mode of practicing the invention, read in connection with the accompanying drawings, in which.

DETAILED DESCRIPTION OF THE INVENTION

Figure 1:
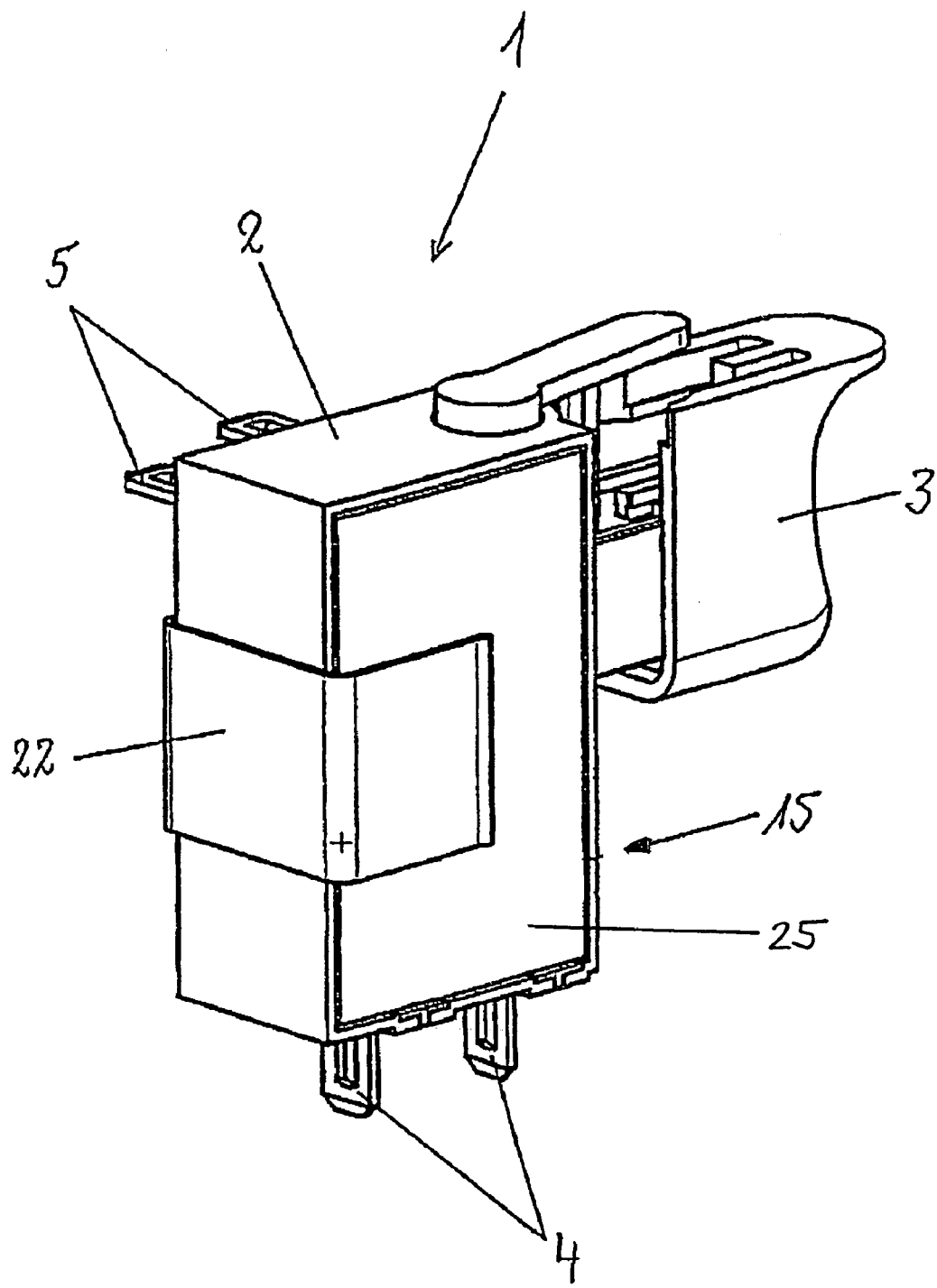
FIG. 1 is a perspective view of an electrical switch according to one embodiment of the present invention.
Figure 2:
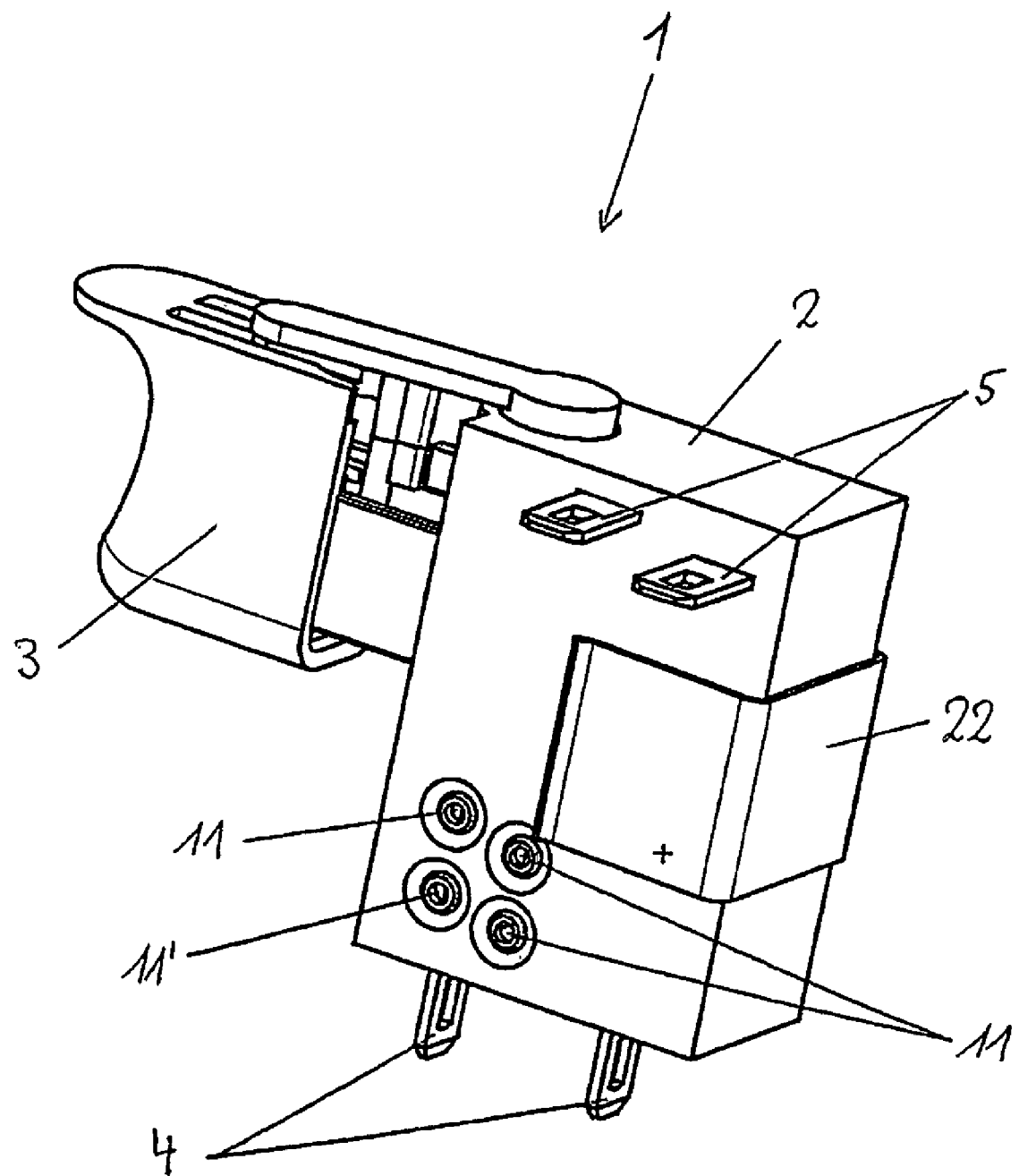
FIG. 2 is another perspective view of the electrical switch.

FIG. 1 shows an electrical switch 1 for a rechargeable electric tool which operates using a DC voltage. The switch 1 has a housing 2 on which there is arranged an actuating member 3 in the form of a pushbutton to be operated by the user. By moving the actuating member 3, the motor of the electric tool is switched on and its rotation speed is set corresponding to the position of the actuating member 3. The switch 1 has electrical input terminals 4 to which the electrical voltage of the rechargeable battery is connected and electrical output terminals 5 (visible in FIG. 2) to which the electrical voltage for operating the electric motor of the electric tool is applied.

Figure 4:
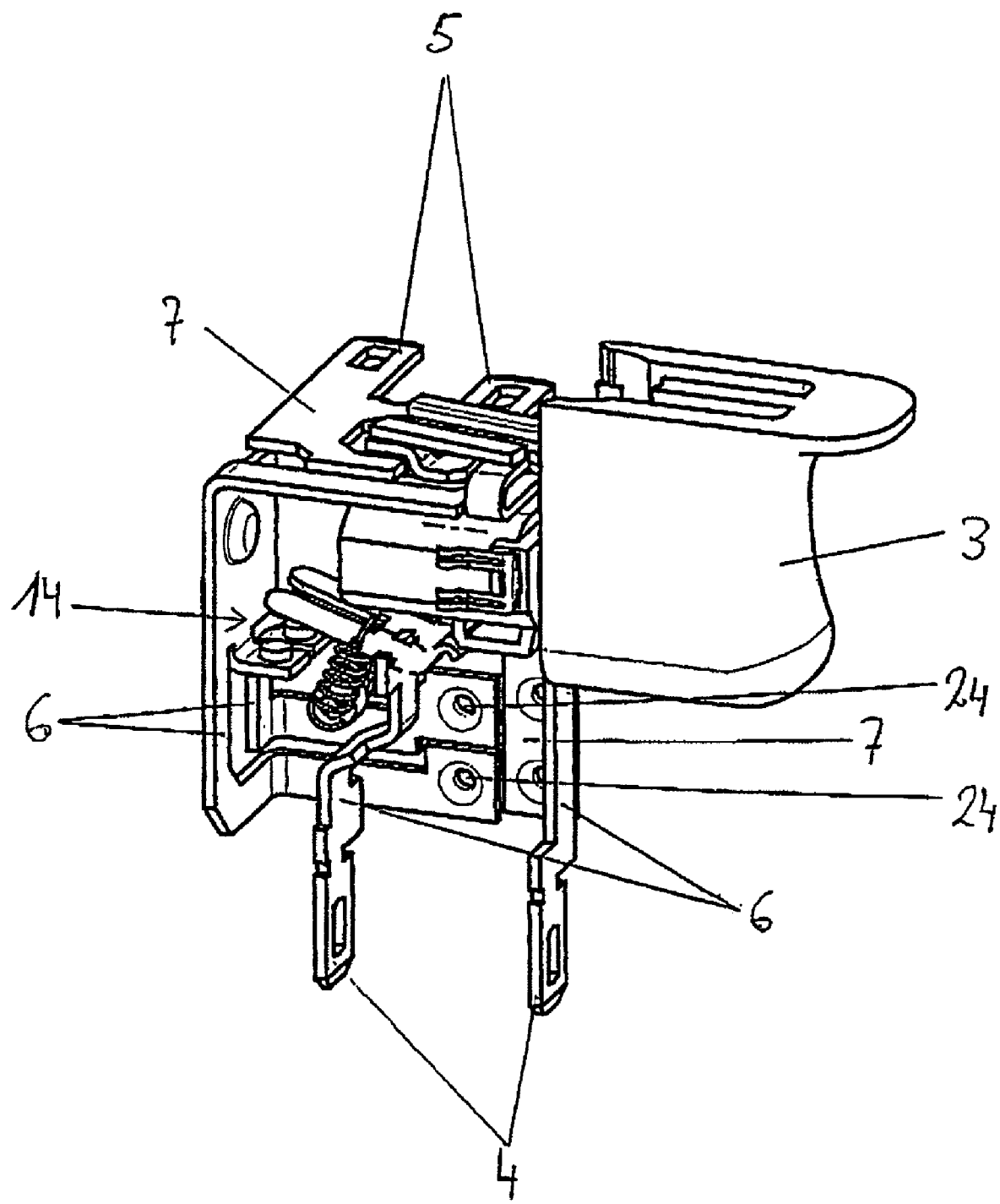
FIG. 4 is a perspective view of the electrical switch showing the voltage conduction parts with the control circuit removed and without a housing.

As can be seen in FIG. 4, the electrical voltage is carried from the input terminals 4, which are connected to the rechargeable battery, by means of power supply lines 6 into and within the interior of the housing 2. The electrical voltage for the purpose of operating the electric motor is in turn carried by means of power supply lines 7 within the housing 2 and from the interior of the housing 2 to the output terminals 5.

Figure 3:
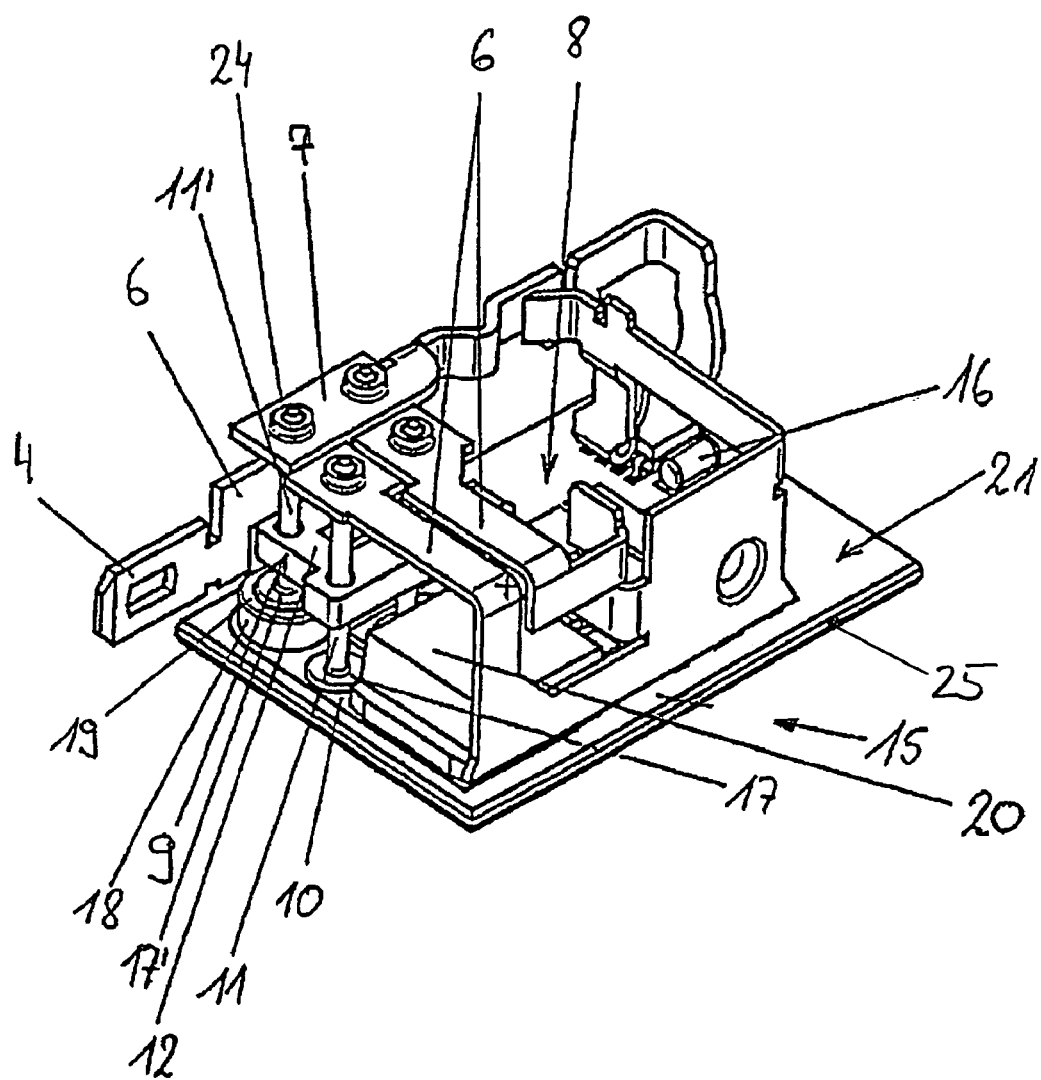
FIG. 3 is a partial assembly view showing the control circuit and voltage-conducting parts of the electrical switch, without a housing.
Figure 5:
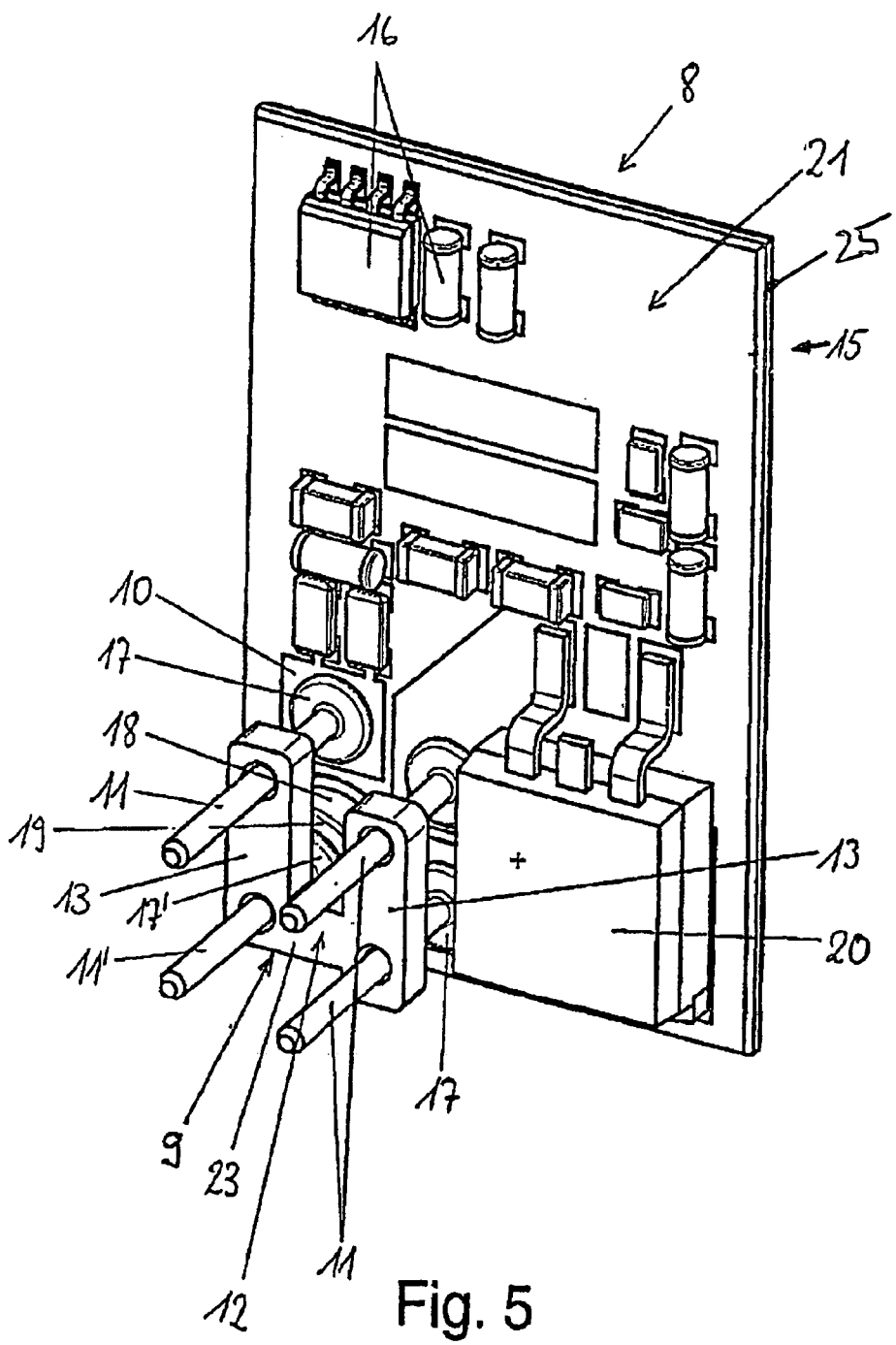
FIG. 5 is a perspective view of the control circuit of the electrical switch.

In order to drive the electric motor at the corresponding rotation speed, the switch 1 has an electronic control circuit 8, which is in the form of a pulse-width modulation circuit as shown in FIGS. 3 and 5. The electrical voltage for the control circuit 8 is supplied by the power supply lines 6 via an electrical connection element 9 to the control circuit 8, as shown in FIG. 3. In addition, the connection element 9 also serves the purpose of supplying the voltage produced by the control circuit 8 for operating the electric motor to the power supply lines 7.

As can further be seen in FIG. 3, the electrical connection element 9 is arranged between a contact face 10 in the control circuit 8 and the electrical power supply lines 6, 7. The connection element 9 is in the form of a module which can be handled independently for further processing purposes and which has at least one metal pin 11 in the form of a solder pin and a fixing element 12 which is made from an electrically non-conductive (i.e., electrically insulating) material. The pin 11 is fixed in the fixing element 12 such that the pin 11 is aligned with respect to the associated contact face 10 and the power supply lines 6, 7. Furthermore, the pin 11 protrudes from the fixing element 12 on both sides for the purpose of making contact with the contact face 10 and the power supply lines 6, 7. Here, the electrical connection element 9 not only serves the purpose of connecting the power supply lines 6, as already mentioned, but also of connecting the further power supply lines 7 such that the connection element 9 has four pins 11 in total.

Contact is made between the pin 11 and the contact face 10 using the SMD (surface mounted device) technique, for which purpose the pin 11 has a flat contact plate 17 at an end thereof which faces the contact face 10. The module-like electrical connection element 9 can thus be assembled as another SMD component by means of automated SMD fitting machines when producing the control circuit 8.

The fixing element 12 is in the form of an approximately U-shaped frame having two limbs 13 and a base 23 for the purpose of receiving the pins 11, as shown in FIG. 5. The limbs 13, the base 23 and the arrangement of the pins 11 correspond to the layout of the contact faces 10 in the control circuit 8. Here, the pins 11 are located essentially in the corners of the U formed by the fixing element 12. The fixing element 12 is made from plastic, and the pins 11 are injection molded into the fixing element 12 by virtue of the pins 11 having the plastic of the fixing element 12 injection molded around them. The pin 11 is made from copper, and it is possible for the pin 11 to be tin-coated on the surface as early as when the connection element 9 is produced for the purpose of simplifying further processing. Once the connection element 9 has been fitted as the control circuit 8 is produced, the pin 11 on the contact plate 17 is then soldered, for example selectively soldered, to the contact face 10. Instead of the pin 11 being provided with a soldered connection, it may of course also be laser-welded, resistance-welded or the like to the contact face 10. The control circuit 8 containing the connection element 9 is then in the form of a separate unit in the manner of a printed circuit board, a thick-layer module or the like, corresponding to FIG. 5.

As can be seen in FIG. 4, the power supply lines 6, 7 are in the form of a stamped grid made from a highly conductive metal, for example copper, in order to be able to accommodate high currents flowing in the switch 1. The power supply lines 6, 7 are also in direct contact with the contact system 14 of the switch 1, such that the power supply lines 6, 7 likewise form a separate unit with the contact system 14, as shown in FIG. 4. On final assembly of the switch 1, this unit comprising the power supply lines 6, 7 together with the contact system 14 is assembled with the other unit, namely with the control circuit 8, when the pin 11 is plugged onto the power supply line 6, 7 with its other end which faces away from the contact plate 17. For this purpose, the other end of the pin 11 is in the form of a mandrel and engages in a corresponding opening 24, hole, aperture or receptacle in the power supply lines 6, 7, as shown in FIG. 3. If required, this other end of the pin 11 is then soldered, in particular selectively soldered, to the power supply lines 6, 7. Of course, instead of soldering, laser-welding, resistance-welding or the like may also take place. This then brings about not only a mechanical, but also an electrical connection between the two units by means of the connection element 9. Finally, the two assembled units are also provided within the housing 2 and completed to form the final switch 1.

As can be seen in FIG. 5, the control circuit 8 has a printed circuit board 15 on which the electrical and/or electronic components 16 for the control circuit are arranged. The contact face 10 is in the form of a conductor track, more particularly, in the form of a contact pad, on the printed circuit board 15. The freewheeling diode 18, which can be seen in FIG. 3, is in the form of an SMD (surface mounted device) component. In the case of the freewheeling diode 18, one electrical terminal 19, which is in the form of an SMD (surface mounted device) terminal, is thus located on the upper side of the freewheeling diode 18. This terminal 19 is likewise used as a contact face for the connection element 9. For this purpose, the pin 11' leading to the terminal 19 of the freewheeling diode 18 is shortened such that the pin 11' ends with its contact plate 17' directly on or at the terminal 19 to the freewheeling diode 18. The contact plate 17' is in turn soldered in a conventional manner to the terminal 19. Of course, the terminal may also be formed in a corresponding manner from further electrical and/or electronic components 16, for example those for the power transistor 20, if desired.

According to one embodiment of the present invention which particularly allows for effective heat dissipation from the switch 1, the printed circuit board 15 is itself part of the housing 2, which can be seen in FIG. 1. For this purpose, the printed circuit board 15 for the control circuit 8 is made from a metal part 25, and the inner surface 21, which is shown in FIG. 5, of the printed circuit board 15 is provided with an electrical insulating layer on that side which is to be fitted with the electrical and/or electronic components 16. The conductor tracks for the purpose of electrically connecting the components 16 in the control circuit 8 are then also located on the electrical insulating layer. The metal part 25 of the printed circuit board 15 is arranged on an outer side of the housing 2 of the switch 1 such that the metal part 25, in addition to its function as a printed circuit board 15, at the same time acts as a cooling body and as a cover for the housing 2. It is possible to fix the metal part 25 of the printed circuit board 15 in a simple manner in manufacturing terms due to the fact that the metal part 25 is fixed to the housing 2 by means of a spring-elastic clip 22. In order to further improve heat dissipation, the clip may also be in the form of an additional resilient cooling body element.

The present invention is not restricted to the exemplary embodiment described and illustrated. Rather, it encompasses all developments by those skilled in the art in the context of the invention defined by the patent claims. For example, the connection element 9 according to the present invention may be used not only in electric tool switches for rechargeable devices, but also in switches for AC voltage devices in which the control circuit is in the form of a phase control circuit, for example. The connection element may also advantageously be used in other electric devices, for example in control devices for motor vehicles, domestic appliances, consumer electronics devices, data processing devices or the like.

While the present invention has been particularly shown and described with reference to the preferred mode as illustrated in the drawings, it will be understood by one skilled in the art that various changes may be effected therein without departing from the spirit and the scope of the invention as defined by the claims.

What is claimed is:

1. An electrical switch for an electric device, comprising:
   a contact system;
   at least one electrical power supply line;
   an electronic control circuit including at least one contact face; and
   an electrical connection element arranged between the at least one contact face of the control circuit and the at least one power supply line;
   wherein the electrical connection element comprises at least one metal pin fixed in an electrically non-conductive fixing element that is spaced a distance from the at least one contact face of the control circuit such that the at least one metal pin is aligned between the at least one contact face and the at least one power supply line, and such that the at least one metal pin protrudes from the fixing element on opposed sides thereof to contact the at least one contact face and the at least one power supply line.

2. The electrical switch of claim 1, wherein the fixing element comprises a plastic material defining an approximately U-shaped frame, and wherein the at least one metal pin is injection molded into the fixing element.

3. The electrical switch of claim 2, wherein the at least one metal pin comprises a plurality of metal pins fixed in the fixing element.

4. The electrical switch of claim 2, wherein the at least one metal pin has a contact plate at one end thereof which faces the contact face of the control circuit.

5. The electrical switch of claim 2, wherein the at least one metal pin is connected to the at least one power supply line via an opening provided in the at least one power supply line.

6. The electrical switch of claim 2, wherein the at least one power supply line comprises a stamped grid, wherein an electrical voltage for the electrical switch is carried via the at least one power supply line, and wherein the at least one power supply line is in communication with at least one of the contact system of the electrical switch and the control circuit of the electrical switch via the at least one metal pin.

7. The electrical switch of claim 2, wherein the at least one contact face of the control circuit comprises a contact pad formed on a printed circuit board, and wherein a plurality of discrete electronic components of the control circuit are arranged on the printed circuit board.

8. The electrical switch of claim 2, which is produced by a method comprising the steps of:
   providing a first unit comprising the connection element attached to the control circuit;
   providing a second unit comprising the contact system including the at least one power supply line; and
   connecting the first and second units via the connection element.

9. The electrical switch of claim 1, wherein the at least one metal pin comprises a plurality of metal pins fixed in the fixing element.

10. The electrical switch of claim 1, wherein the at least one metal pin comprises a copper pin having tin coated on a surface thereof.

11. The electrical switch of claim 1, wherein the at least one metal pin has a contact plate at one end thereof which faces the contact face of the control circuit.

12. The electrical switch of claim 1, wherein the at least one metal pin is connected to the at least one power supply line via an opening provided in the at least one power supply line.

13. The electrical switch of claim 1, wherein the at least one power supply line comprises a stamped grid, wherein an electrical voltage for the electrical switch is earned via the at least one power supply line, and wherein the at least one power supply line is in communication with at least one of the contact system of the electrical switch and the control circuit of the electrical switch via the at least one metal pin.

14. The electrical switch of claim 1, wherein the at least one contact face of the control circuit comprises a surface mounted device terminal for electronic components of the control circuit.

15. The electrical switch of claim 14, wherein the at least one metal pin directly contacts the terminal via a contact plate provided at an end of the at least one metal pin.

16. The electrical switch of claim 15, wherein the at least one pin leading to the terminal is designed to be shortened such that the at least one pin ends directly at the terminal by means of the contact plate.

17. The electrical switch of claim 1, wherein the at least one contact face of the control circuit comprises a contact pad formed on a printed circuit board, and wherein a plurality of discrete electronic components of the control circuit are arranged on the printed circuit board.

18. The electrical switch of claim 17, wherein the printed circuit board comprises an electrically insulating layer provided on a surface of a metal part, and wherein the electronic components and the at least one contact pad of the control circuit are provided on the insulating layer.

19. The electrical switch of claim 18, wherein the metal part is arranged on an outer side of the housing of the switch such that the metal part also simultaneously acts as a cooling body and as a cover for the housing.

20. The electrical switch of claim 19, wherein the metal part is fixed to the housing via a spring-elastic clip.

21. The electrical switch of claim 1, which is produced by a method comprising the steps of:
   providing a first unit comprising the connection element attached to the control circuit;
   providing a second unit comprising the contact system including the at least one power supply line; and
   connecting the first and second units via the connection element.

* * * * *

UNITED STATES PATENT AND TRADEMARK OFFICE
CERTIFICATE OF CORRECTION

| | | |
|---|---|---|
| PATENT NO. | : 7,121,893 B2 | Page 1 of 1 |
| APPLICATION NO. | : 11/186617 | |
| DATED | : October 17, 2006 | |
| INVENTOR(S) | : Peter Broghammer and Peter Wahl | |

It is certified that error appears in the above-identified patent and that said Letters Patent is hereby corrected as shown below:

<u>Column 8</u>

*Line 13*: please change "earned" to --carried--

Signed and Sealed this

Second Day of January, 2007

JON W. DUDAS
*Director of the United States Patent and Trademark Office*